United States Patent [19]

Moussie

[11] Patent Number: 4,835,771
[45] Date of Patent: May 30, 1989

[54] INTEGRATED DIGITAL MULTIPLEXER CIRCUIT

[75] Inventor: Michel Moussie, Caen, France

[73] Assignee: U.S. Philips Corporation, New York, N.Y.

[21] Appl. No.: 256,162

[22] Filed: Oct. 7, 1988

Related U.S. Application Data

[63] Continuation of Ser. No. 178,821, Mar. 29, 1988, abandoned, which is a continuation of Ser. No. 858,480, May 1, 1986, abandoned.

[30] Foreign Application Priority Data

May 10, 1985 [FR] France ................ 85 07122

[51] Int. Cl.$^4$ ............................ H03K 17/62
[52] U.S. Cl. ................... 370/112; 307/243; 307/299.2; 307/455
[58] Field of Search ............ 370/112; 307/243, 299.2, 307/455; 328/104, 154

[56] References Cited

U.S. PATENT DOCUMENTS

| | | | |
|---|---|---|---|
| 3,539,824 | 11/1970 | Yu et al. ................. | 307/455 |
| 3,629,610 | 12/1971 | Wilhelm ................. | 307/455 |
| 3,925,651 | 12/1975 | Miller ................. | 307/455 X |
| 3,984,702 | 10/1976 | Fett ................. | 307/455 X |
| 4,191,856 | 3/1980 | Nagano et al. ................. | 307/243 X |
| 4,616,358 | 10/1986 | Rehm et al. ................. | 370/112 X |
| 4,621,201 | 11/1986 | Amdahl et al. ................. | 307/455 X |
| 4,628,216 | 12/1986 | Mazumder ................. | 307/455 |

FOREIGN PATENT DOCUMENTS

| | | | |
|---|---|---|---|
| 0176908 | 4/1986 | European Pat. Off. ............ | 307/455 |
| 0176909 | 4/1986 | European Pat. Off. ............ | 307/455 |

OTHER PUBLICATIONS

"Sylvania Universal High–Level Logic", Brochure, Feb. 5, 1965, pp. 1–4.

Primary Examiner—Douglas W. Olms
Assistant Examiner—Melvin Maralo
Attorney, Agent, or Firm—Edward W. Goodman

[57] ABSTRACT

A multiplexer module includes N input transistors ($T_0$ to $T_3$) whose bases receive input signals ($E_0 \ldots E_3$), whose collectors are connected to ground and whose emitters are coupled to those of a multi-emitter output transister $T'_4$. A logic addressing circuit (ALC) connects a current source I to one of the emitters of the input transistors ($T_0$ to $T_3$) as a function of an address ($A_0$, $A_1$) received. Any reference voltage on the output transistor ($T'_4$) is suppressed by short-circuiting its base and its collector which constitutes the output S' which is connected to ground by way of an output resistor $R'_s$. The module may be connected to other modules (having e.g. K inputs) within the same circuit, notably in order to realize a multiplexer having $N^k$ inputs without giving rise to stray coupling between the outputs of the various modules.

4 Claims, 3 Drawing Sheets

INTEGRATED DIGITAL MULTIPLEXER CIRCUIT

This is a continuation of application Ser. No. 07/178,821, filed Mar. 29, 1988, abandoned, which is a continuation of application Ser. No. 06/858,480, filed May 1, 1986, abandoned.

BACKGROUND OF THE INVENTION

The invention relates to a digital multiplexer module which includes a number of inputs. Each input is formed by the base of an input transistor of a first group whose collector is connected to a first supply voltage source and whose emitter is coupled to an electrode of a first type of a first semiconductor output element. The output element includes a plurality of electrodes of the first type, as well as one electrode of a second type which is connected to said first supply voltage source via a first output resistor, which module also includes a first logic addressing circuit which includes a plurality of inputs and serves to connect a first current source, referred to as a second supply voltage source, to one of the emitters of the input transistors of the first group as a function of the address received.

Such a multiplexer is known of from Japanese patent application No. 54 25880, dated Mar. 6, 1979, published as No. 55 118229 and entitled "Multiplexer circuit.".

Therein the number of inputs equals 3 and said semiconductor output element is formed by a multi-emitter transistor whose emitters form the electrodes of the first type, whose base receives a reference voltage and whose collector, being the electrode of the second type, forms the output of the multiplexer and is connected to ground across a fixed resistor.

When several multiplexers of this kind are used in the same circuit, the same reference voltage source feeds the bases of the multi-emitter output transistors, and this causes stray coupling between the outputs of the multiplexers.

SUMMARY OF THE INVENTION

It is an object of the invention to provide a multiplexer module whose output stages does not require a reference voltage; this offers the advantage of greater intrinsic simplicity, and the described drawback which occurs when the module is connected to other modules can be avoided.

To achieve this, the multiplexer module in accordance with the invention is characterized in that the first semiconductor output element includes a plurality of diodes having a common electrode which constitutes the electrode of the second type, the other electrodes thereof each forming one of the electrodes of the first type.

Preferably, the first semiconductor output element is formed by a first multi-emitter output transistor whose base and collector are interconnected and constitute the electrode of the second type, while its emitters constitute the electrodes of the first type.

As will be explained hereinafter, one of the logic levels on the output of the module is thus shifted slightly with respect to the standardized level. Therefore, such a module is preferably used for actuating a stage which is situated in the same integrated or hybrid circuit, which means that a short electrical connection exists.

The multiplexer module in accordance with the invention also offers another important advantage. As a result of the fact that, as will be demonstrated hereinafter, the first semiconductor output element is always traversed by a current, however small it may be, the module in accordance with the invention will be substantially faster than the known module.

An embodiment of the module in accordance with the invention includes $2^n$ inputs for which the first logic addressing circuit includes n cascade-connected differential stages, the $k^{th}$ stage having $2^{k-1}$ differential pairs, each of which includes two emitter-coupled transistors, one of which receives a $k^{th}$ reference addressing voltage on its base while the other transistor receives a logic stage address level on its base, the collectors of the transistors of the differential pairs of the $(n-1)$ first stages being connected to the common junction of the emitters of a differential pair of the stage of directly higher rank, each of the collectors of the transistors of the $n^{th}$ stage being connected to an emitter of an input transistor.

The supply voltage source may be connected to ground potential in known manner and the addressing reference voltages may be negative.

The invention also relates to an integrated digital multiplexer circuit which includes $N^k$ inputs connected to K input multiplexer modules, each having N inputs, and an output multiplexer module having K inputs, each of which receives an output signal of one of the input modules.

In a first version, the output multiplexer module is also of the type defined above, so that the output transistor of the multiplexer does not carry a reference voltage.

In a preferred version, the output multiplexer module is of a known type, so that only the output transistor of the output multiplexer module carries a reference voltage. Hence, the integrated digital multiplexer circuit provides output signals having the standardized level without giving rise to stray coupling.

The output multiplexer module may include an addressing circuit of the same type as the input multiplexer modules. The current sources governed by the addressing circuits of the input multiplexer modules and the output multiplexer module may supply the same intensity; in that case, the first output resistor of each of the input multiplexer modules has a value which is twice as large as the second output resistor of the output multiplexer module.

In a particularly useful embodiment of the preferred version, the collectors of the input transistors of the output multiplexer module are interconnected and are connected and to the supply voltage source via a third output resistor which has the same value as the second output resistor, so that the signal present on the collectors of the input transistors of the second group constitutes an inverted logic output signal of the multiplexer.

In a second embodiment of the second version, the multiplexer includes a connection circuit which is controlled by a logic storage signal which has a first and a second state. The connection circuit connects the second current source to the second logic addressing circuit (multiplexing function), in the first state, and, in the second state to a storage transistor whose emitter is connected to an $N+1^{th}$ emitter of the second output transistor, the base of said storage transistor being connected to the collector of said output transistor while its collector is connected to said supply voltage source, the storage transistor ensuring that in the second state, the level of the collector of the second output transistor is maintained (storage function).

The invention will be described in detail hereinafter with reference to the accompanying drawings:

DESCRIPTION OF THE PREFERRED EMBODIMENT

Figure 1:
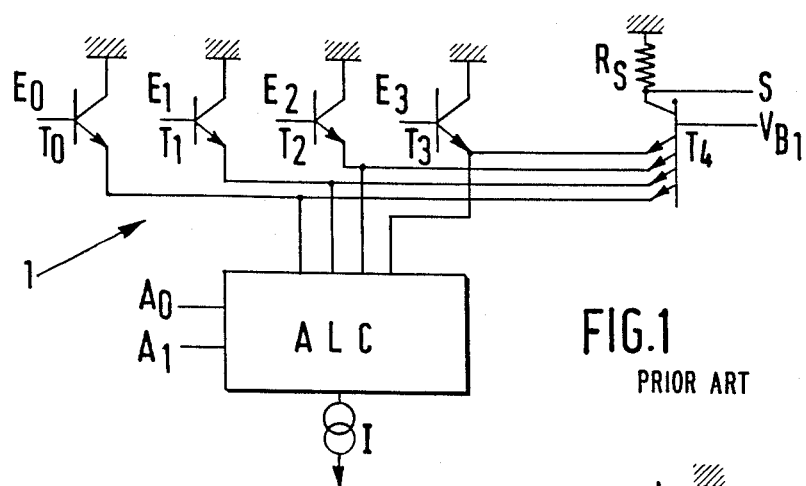
FIG. 1 shows a known multiplexer module which includes four inputs.

A known four-input multiplexer 1, as shown in FIG. 1, includes four input transistors $T_0$ to $T_3$ whose bases receive logic input signals $E_0$ to $E_3$, respectively, the collectors thereof being connected to ground while the emitters are connected to emitters of a multi-emitter output transistor $T_4$. The base of the transistor $T_4$ receives a reference voltage $V_{B1}$ and its collector, supplying the output signal S of the multiplexer, is connected to ground across an output resistor $R_S$.

A logic addressing circuit ALC receives two logic address signals $A_0$ and $A_1$ which define four logic states for each of which the current source I, referred to, as customary, a voltage source $V_{EE'}$ is connected to an emitter of the input transistors $T_0$ to $T_3$, thus enabling the selection of one of the inputs $E_0$ to $E_3$. Considering that each of the inputs may be either at a standardized high level H of 0 V or at a standardized low level L of −450 mV, where $V_{B1}=−225$ mV and $R_sI=450$ mV (absolute values), the level of the selected input, for example $E_2$, reappears on the output S. Actually, if $E_2$ carries the high level H (0 V), the entire current I passes through the transistor $T_2$ and S=0 V. When $E_2$ is at the low level L (−450 mV), the entire current I passes through the transistor $T_4$ across the emitter thereof which is coupled to that of transistor $T_2$.

Figure 2A:
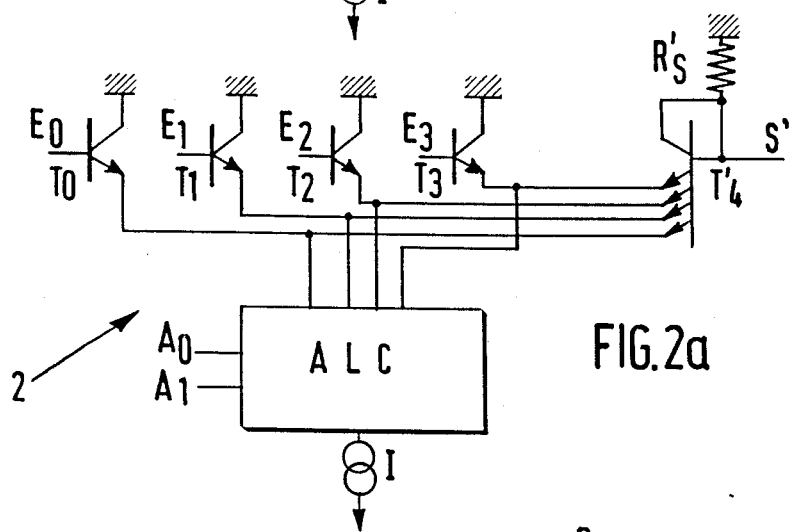
FIG. 2a shows a multiplexer module in accordance with the invention which includes four inputs.

The multiplexer module 2, in accordance with the invention shown in FIG. 2a, includes elements which correspond to those of the known module shown in FIG. 1: the transistors $T_0$ to $T_3$ whose bases receive the input signals $E_0$ to $E_3$, respectively, the logic addressing circuit ALC with its logic address signals $A_0$ and $A_1$, as well as the current source I which is connected to the transistor corresponding the selected input.

However, the connection of the output transistor is different. As before, it concerns a multi-emitter transistor, now referred to as $T'_4$, whose emitters are respectively coupled to those of the transistors $T_0$ to $T_3$, but whose base and collector are mutually short-circuited, thus forming the output S' of the module, and are connected to ground via an output $R'_s$.

Figure 3:
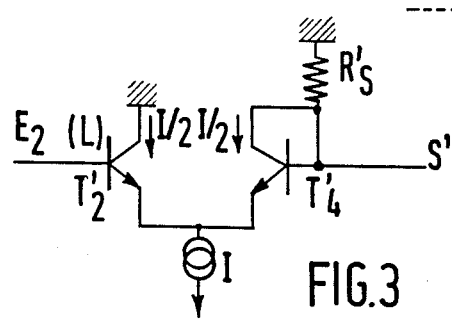
FIG. 3 shows a diagram illustrating the operation of the multiplexer module shown in the FIGS. 2a and 2b.

Assume that, as before, the selected input is $E_2$. If $E_2$ is at the high level H (0 V), the current I passes substantially completely (approximately 90%) through the transistor $T'_2$ and the output S' of the module is at a slightly negative level, which is, in practice, in the order of −90 mV. If $E_2$ is at the low level L (−450 mV) (see the equivalent diagram of FIG. 3) and if $R'_sI=900$ mV (absolute value), the current I is distributed equally (I/2) between the transistor $T'_2$ and $T'_4$, when these transistors include emitters having the same geometry. When a multiplexer module 2, in accordance with the invention, both being compared with a known multiplexer 1 is provided with a current source I of the same intensity, $R'_s$ must be equal to $2R_s$ in order to obtain a low level B' of −450 mV on the output S'.

As has already been demonstrated, the output signal S' of the multiplexer module 2, in accordance with the invention, cannot be used directly as a standardized output signal which is accessible from outside the circuit in which the module is included, because its high level H' has been shifted with respect to ground potential. It is much closer to the low level B' than in the known state of the art. On the other hand, the output transistor $T'_4$ is always conductive, be it ever so slightly, so that the module in accordance with the invention is faster than the known module.

The output signal S' may be used for actuating a logic stage situated in the same circuit, that is to say, by way of a short electrical connection.

The transistor $T'_4$ of FIG. 2a is electrically equivalent to four diodes D having a common anode which is connected to the output S' (terminal not connected to the ground of the resistor $R'_s$), their cathodes being connected to respective emitters of the transistors $T_0$ to $T_3$. In practice the circuit shown in FIG. 2a is faster and this fact is utilized. Another equivalent circuit is constituted by four transistors whose bases and collectors are connected together.

Figure 4:
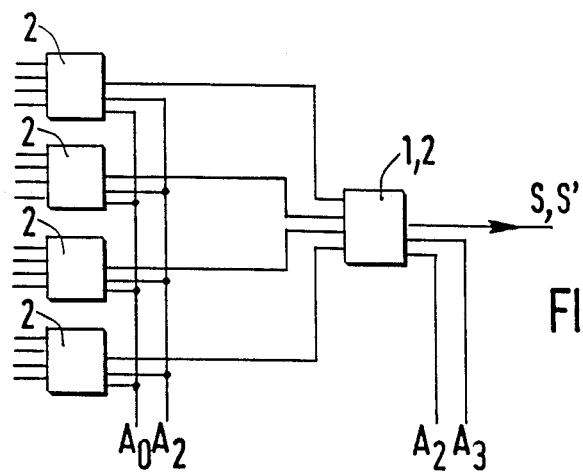
FIG. 4 shows a multiplexer in accordance with the invention which includes sixteen inputs and which links five multiplexer modules.

FIG. 4 shows a 16-channel multiplexer circuit which includes four input multiplexer modules 2 in accordance with the invention, each of which receives the logic address signals $A_0$ and A, and the output of which actuates either (first alternative) an output multiplexer module 2 in accordance with the invention (FIG. 2) which receives two logic address signals $A_2$ and $A_3$ in order to form an output signal S' which can be used only for actuating a logic stage included in the same circuit, or (preferred version) an output multiplexer module 1 of the known type (FIG. 1) which receives two logic address signals $A_2$ and $A_3$ in order to form a standardized output signal S which can be used outside the circuit in which the multiplexer circuit is included. In the preferred version, only the output multiplexer module 1 includes an output transistor which receives its own reference voltage, so that any stray coupling between the outputs of the input multiplexer modules is prevented. In other words, a 16-channel multiplexer circuit is obtained which includes the same inputs and the same outputs as a multiplexer circuit provided with known input multiplexer modules 1, but which does not involve any stray couplings.

Figure 2B:
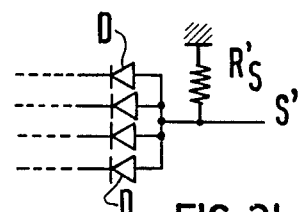
FIG. 2b shows an equivalent diagram.
Figure 5:
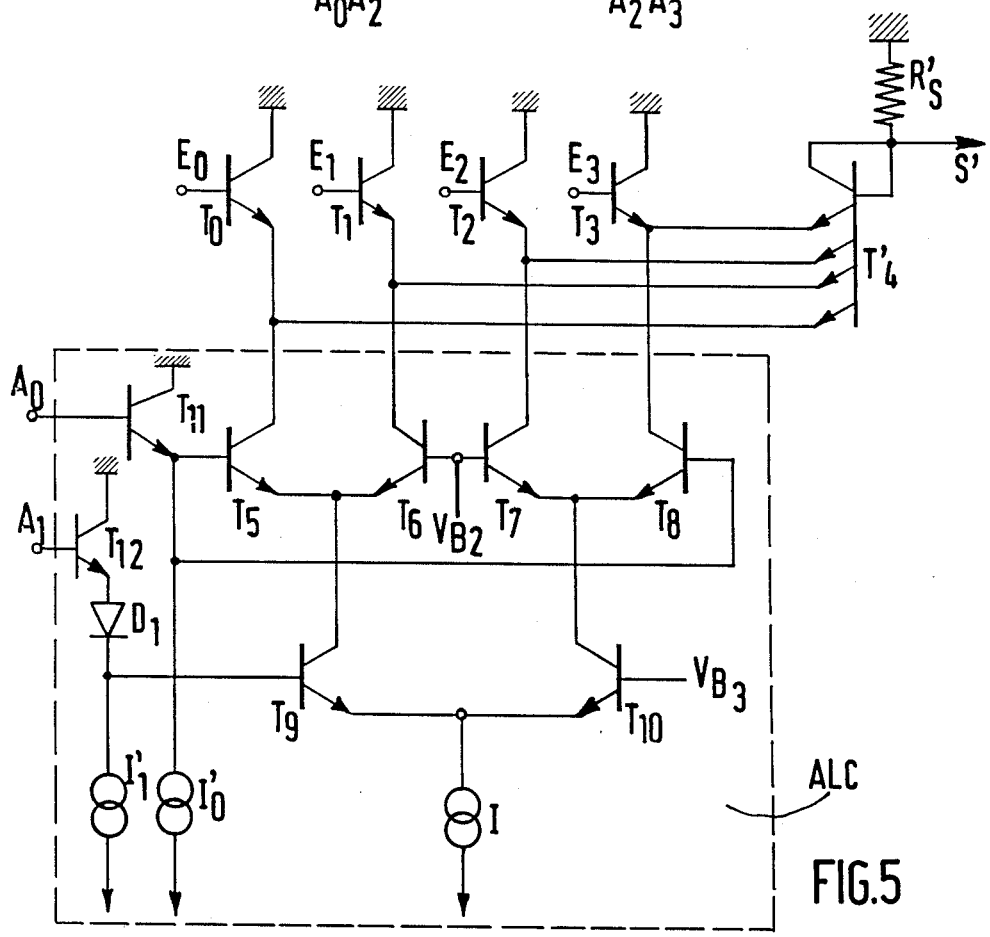
FIG. 5 shows an embodiment of the multiplexer module shown in FIG. 2.

FIG. 5 illustrates an embodiment of the logic addressing circuit ALC in a multiplexer module 2 as shown in FIG. 2. The logic signal $A_o$ actuates the base of transistor $T_{11}$ which is connected as an emitter follower and whose collector is a connected to ground, so that the signal $A_o$ is shifted by approximately −0.8 V (value corresponding to the voltage $V_{BE}$ of a transistor), and it can actuate a stage which includes two cells, each of which includes two emitter-coupled transistors ($T_5$, $T_6$) and ($T_7$, $T_8$).

The emitter of $T_{11}$ actuates the bases of $T_5$ and $T_8$ and is charged by a current source $I_0'$, while the base of $T_6$ and $T_7$ receive a reference voltage $V'_{B2}$ which equals approximately $-1$. V; the level of $A_0$ has been shifted to the latter value by the transistor $T_{11}$ ($V_{BE}=0.8$ V) and thereto the mean value of the gap between the low level and the high level ($-0.225$ mV), is added The collectors of the transistors $T_5$ to $T_8$ are connected to respective emitters of $T_0$ to $T_3$.

The logic address signal $A_1$ actuates the base of a transistor $T_{12}$ which is connected as an emitter follower and whose collector is connected to ground. The emitter of the transistor $T_{12}$ actuates a diode $D_1$ so that the signal $A_1$ is shifted by approximately $-1.6$ V (value corresponding to the voltage $V_{BE}$ of a transistor, increased by the voltage of a diode). The cathode of the diode $D_1$, being charged by a current source $I'_1$, actuates the base of a transistor $T_9$ which is emitter-coupled to a transistor $T_{10}$ whose base receives a reference voltage $V'B_3$ equal to approximately $-1.8$ V, taking into account the shift ($-1.6$ V) of the level of the signal $A_1$ by $T_{12}$ and $D_1$. The emitters of $T_9$ and $T_{10}$ are charged by the current source I to be connected, the collector of $T_9$ being connected to the emitters of $T_5$ and $T_6$ and the collector of $T_{10}$ to the emitters of $T_7$ and $T_8$. For the selection of the transistor $T_2$ chosen in the previous example, it is necessary to indicate the address $A_0=0$ (low level B) and $A_1=0$ (low level B), so that the current I flows through the transistors $T_7$ and $T_{10}$. $T_0$ is selected with $A_0=1$ (high level H) and $A_1=1$ (high level H); $T_1$ with $A_0=0$ and $A_1=1$; and $T_3$ with $A_0=1$ and $A_1=0$.

Figure 6:
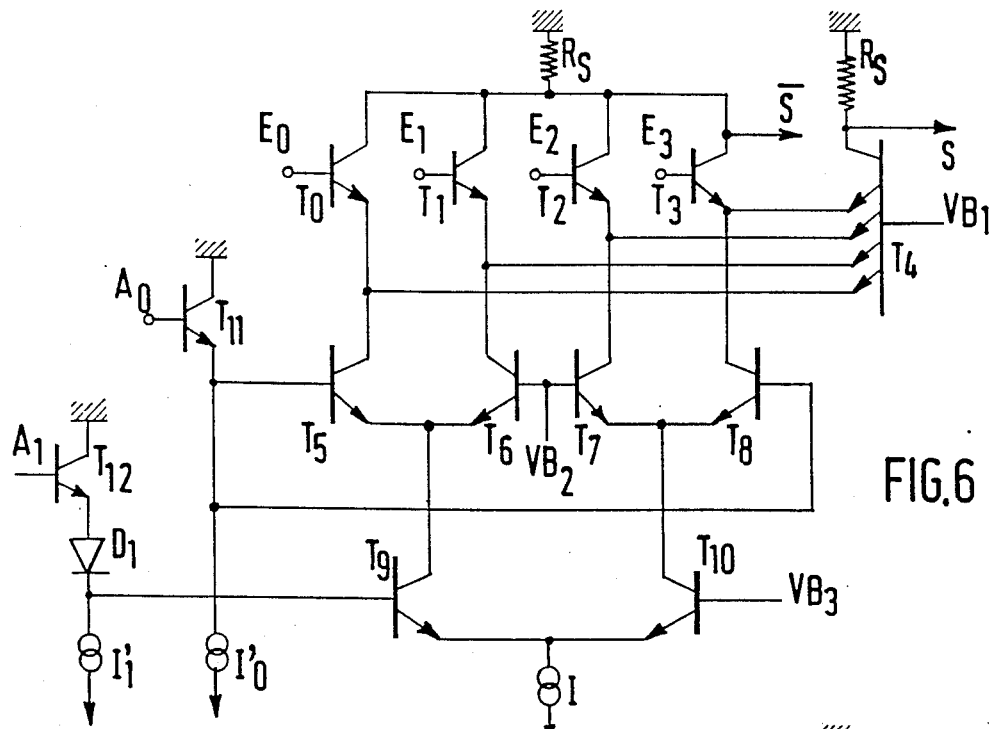
FIG. 6 shows an embodiment of the multiplexer module of FIG. 4 which includes an output and an inverted output.

FIG. 6 shows a preferred embodiment of the output multiplexer circuit module 1 of the 16-channel multiplexer shown in FIG. 4. It includes the four transistors $T_0$ to $T_3$ which receive the input signals $E_0$ to $E_3$, the base of the output transistor $T_4$ receiving the reference voltage $V_{B1}=-225$ mV, and a logic addressing circuit which includes the same elements as shown in FIG. 5 and which receives the same reference voltages $V_{B2}$ and $V_{B3}$. The collectors of the transistors $T_0$ to $T_3$ are not connected directly to ground; they are interconnected and connected to ground via a second resistor $R_S$ of the same value that is connected to the collector of the transistor $T_4$. The collector of the transistors $T_0$ to $T_3$ thus forms an inverting output on which the inverted output signal $\bar{S}$ appears simultaneously with the output signal S. This is possible because of the fact that the high level H' of the outputs of the multiplexer modules 2 in accordance with the invention is slightly below the standardized 0 V level, that is to say, a value of approximately $-60$ mV. This difference in level is sufficient to allow the collector of the transistors $T_0$ to $T_3$ to be charged by the second resistor $R_S$ without risk of saturation of any transistor receiving a high input signal.

Figure 7:
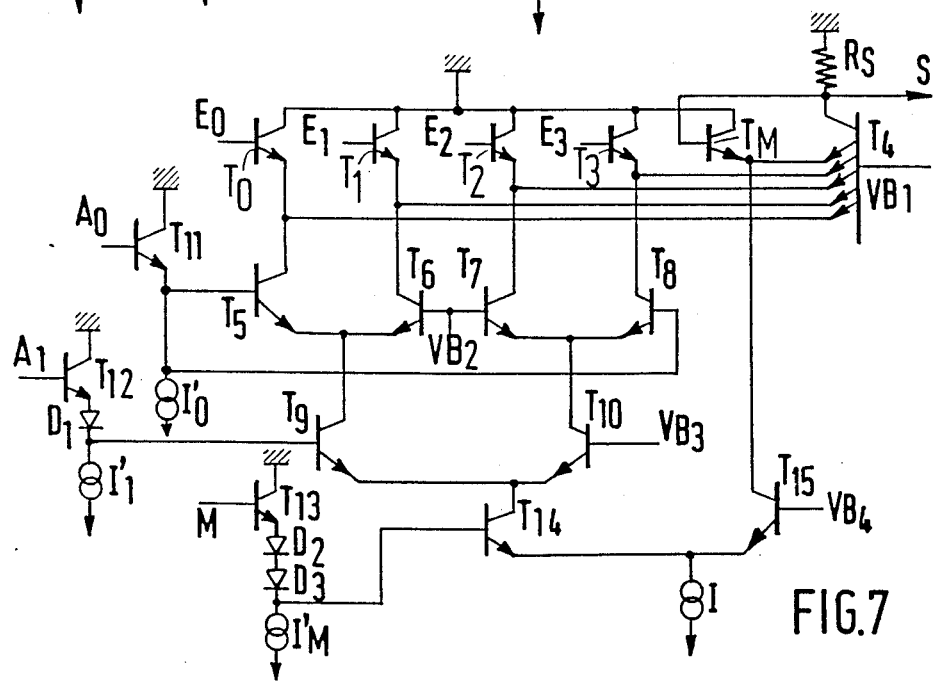
FIG. 7 shows an embodiment of the multiplexer module of FIG. 4 which has a storage function.

FIG. 7 shows a further embodiment of the output module 1 of the 16-channel multiplexer circuit shown in FIG. 4. It includes the four transistors $T_0$ to $T_3$ whose collectors are connected to ground and which receive the input signals $E_0$ to $E_3$ on their bases, the output transistor $T_{4'}$ which receives the reference voltage $V_{B1}=-225$ mV on its base, and an addressing circuit which includes the same elements as that shown in FIG. 6, except that the current source I is connected to a connection circuit enabling a storage transistor $T_M$ to act as a store for the output signal S of the transistor $T_4$.

The base of a transistor $T_{13}$ receives a storage control signal M. Its emitter is connected to the base of a transistor $T_{14}$ via two cascade-connected diodes $D_2$ and $D_3$ which are charged by a current source $I'_M$. The transistor $T_{14}$ is coupled, by way of its emitter, to a transistor $T_{15}$ whose base receives a reference voltage $V_{B4}=V_{B3}-V_{BE}$. The current source I is connected to the emitters of $T_{14}$ and $T_{15}$. The collector of $T_{14}$ is connected to the emitters of $T_9$ and $T_{10}$.

The base of the storage transistor $T_M$ is connected to the collector of the output transistor $T_4$ which delivers the output signal S, its collector being connected to ground, while its emitter is coupled to a fifth emitter of $T_4$ as well as to the collector of $T_{15}$.

When the storage control signal M is high, the current I flows through $T_{14}$ and the output module acts as a multiplexer. When the storage control signal M is low, the current I flows through the transistor $T_{15}$ and the transistor $T_M$ maintains the state of the output S, regardless of the signals arriving on the inputs $E_0$ to $E_3$ (storage function). Evidently, if S is high, $T_{M'}$ which receives this signal on its base, is traversed by the current I, thus maintaining S at the high level. However, if S is low, $T_4$ is still traverse by the current I, because $T_M$ is blocked by the signal S received on its base.

Thus, there are described several embodiments of the invention which will be described more particularly in the claims which follow.

What is claimed is:

1. An integrated multiplexer circuit comprising a plurality of input multiplexer modules being coupled to at least one output multiplexer module, each multiplexer module including an associated number of input terminals and an output terminal, the input terminal being formed by a base of an associated input transistor, whose collector is connected to a first supply terminal and whose emitter is connected to one of a plurality of electrodes of a first type of an output element, the output element having an electrode of a second type connected to the first supply terminal via an output resistance, the output terminal being formed by a connection between the output resistance and the electrode of the second type, and each multiplexer module further including a logic addressing circuit for receiving an address signal and, in dependence thereon, thereupon connecting a current source, connected to a second supply terminal, to the emitter of one of the input transistors of the relevant multiplexer module, characterized in that the output element of each input multiplexer module comprises a plurality of diodes, each diode having a first and a second terminal, the first terminals being the electrodes of the first type, the second terminals being interconnected and constituting the electrode of the second type.

2. An integrated multiplexer circuit comprising a plurality of input multiplexer modules being coupled to at least one output multiplexer module, each multiplexer module including an associated number of input terminals and an output terminal, the input terminal being formed by a base of an associated input transistor, whose collector is connected to a first supply terminal and whose emitter is connected to one of a plurality of electrodes of a first type of an output element, the output element having an electrode of a second type connected to the first supply terminal via an output resistance, the output terminal being formed by a connection between the output resistance and the electrode of the second type, and each multiplexer module further including a logic addressing circuit for receiving an address signal and, in dependence thereon, thereupon connecting a current source, connected to a second supply terminal, to the emitter of one of the input transistors of the relevant multiplexer module, characterized in that the output element of each input multiplexer module comprises a multi-emitter transistor having its base connected to its collector thereby constituting the electrode of the second type and having its emitters constituting the electrodes of the first type.

3. An integrated multiplexer-circuit as claimed in claim 1 or 2, characterized in that the output multiplexer module and the input multiplexer modules are identical.

4. An integrated-multiplexer circuit as claimed in claim 1 or 2, whereby the output element of the output multiplexer module comprises a multi-emitter transistor, the collector thereof being the electrode of the second type, its emitters constituting the electrodes of the first and its base being connected to a reference voltage supply terminal, characterized in that the current sources in the multiplexer modules all have the same intensity, and the output resistances of the input multiplexer modules, each having mutually the same value, being twice the value of the output resistance of the output multiplexer module.

* * * * *